United States Patent [19]

Iso et al.

[11] 4,392,020

[45] Jul. 5, 1983

[54] STEREO DEMODULATION SYSTEM FOR AN FM STEREO BROADCAST RECEIVER

[75] Inventors: Yoshimi Iso; Shigeki Inoue; Toshifumi Shibuya, all of Toyokawa, Japan

[73] Assignee: Hitachi, Ltd., Tokyo, Japan

[21] Appl. No.: 236,536

[22] Filed: Feb. 20, 1981

[30] Foreign Application Priority Data

Feb. 27, 1980 [JP] Japan .................................. 55-22793
Oct. 9, 1980 [JP] Japan .................................. 55-140507

[51] Int. Cl.³ .............................................. H04H 5/00
[52] U.S. Cl. .................................. 179/1 GE; 329/167
[58] Field of Search .............. 329/50, 167; 179/1 GE, 179/1 GD

[56] References Cited

U.S. PATENT DOCUMENTS 4,037,055 7/1977 Sato et al. .
4,334,125 6/1982 Inoue .............................. 179/1 GE Primary Examiner—R. J. Hickey
Attorney, Agent, or Firm—Kenyon & Kenyon

[57] ABSTRACT

A stereo demodulation system for an FM stereo broadcast receiver having frequency dividing means receiving the output of the voltage controlled oscillator in the phase locked loop and producing the first and the second switching signals which are supplied to the first and the second switch and decoder circuit for switching and decoding the stereo composite signal, wherein said first and second switching signals are produced with the fixed phase relationship therebetween.

15 Claims, 37 Drawing Figures

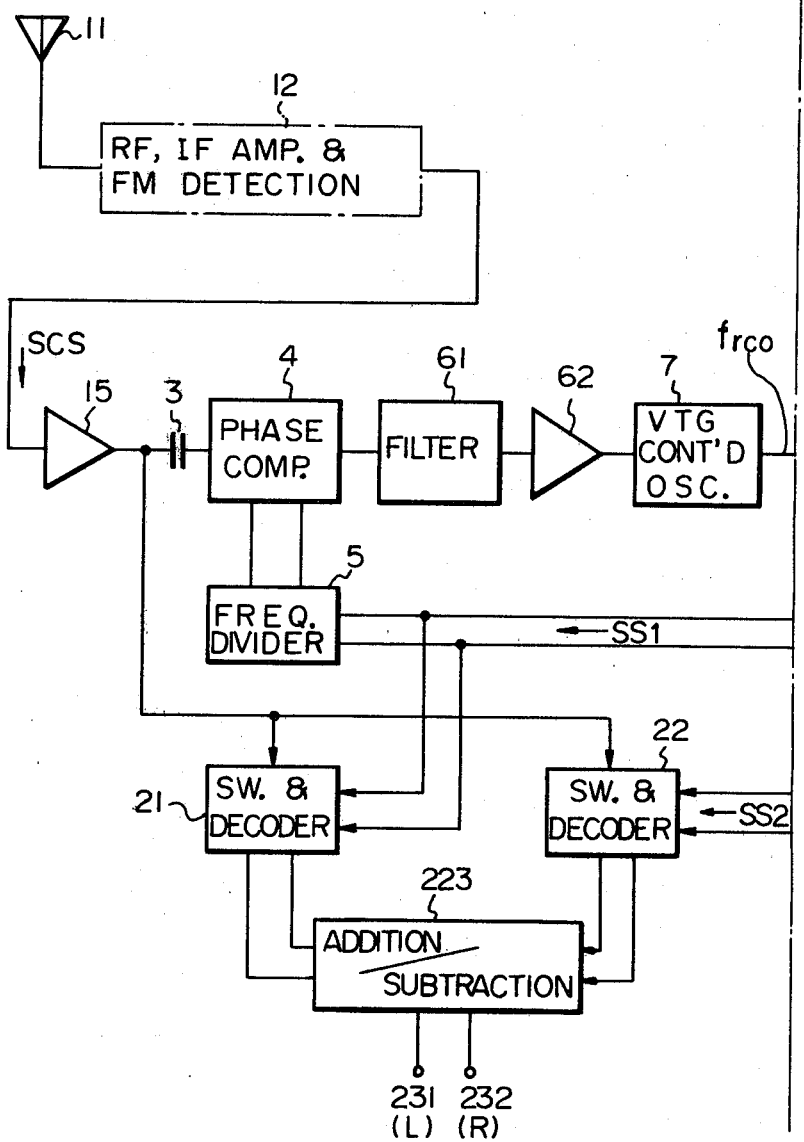

| STATE NUMBER | INPUT | | | | | OUTPUT | |
|---|---|---|---|---|---|---|---|
| | CL | PR | J | K | CK | $Q_{n+1}$ | $\overline{Q}_{n+1}$ |
| 1 | 0 | 1 | X | X | X | $\overline{Q}_{n+1}$ | $\overline{Q}_{n+1}$ |
| 2 | 1 | 0 | X | X | X | 1 | 0 |
| 3 | 1 | 1 | X | X | X | 0 | 1 |
| 4 | 0 | 0 | 0 | 0 | P.E. | $Q_n$ | $\overline{Q}_{n+1}$ |
| 5 | 0 | 0 | 0 | 1 | P.E. | 0 | 1 |
| 6 | 0 | 0 | 1 | 0 | P.E. | 1 | 0 |
| 7 | 0 | 0 | X | X | P.E. | $\overline{Q}_n$ | $Q_n$ |
| 8 | 0 | 0 | X | X | N.E. | $Q_n$ | $\overline{Q}_n$ |

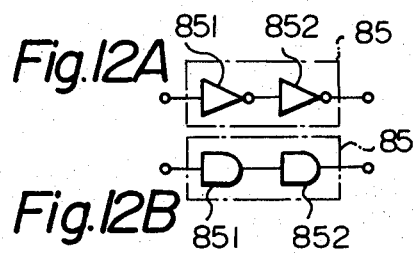
Fig.12A
Fig.12B
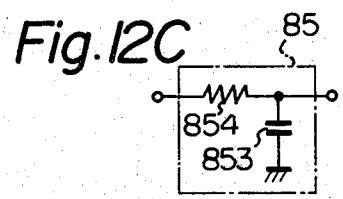
Fig.12C
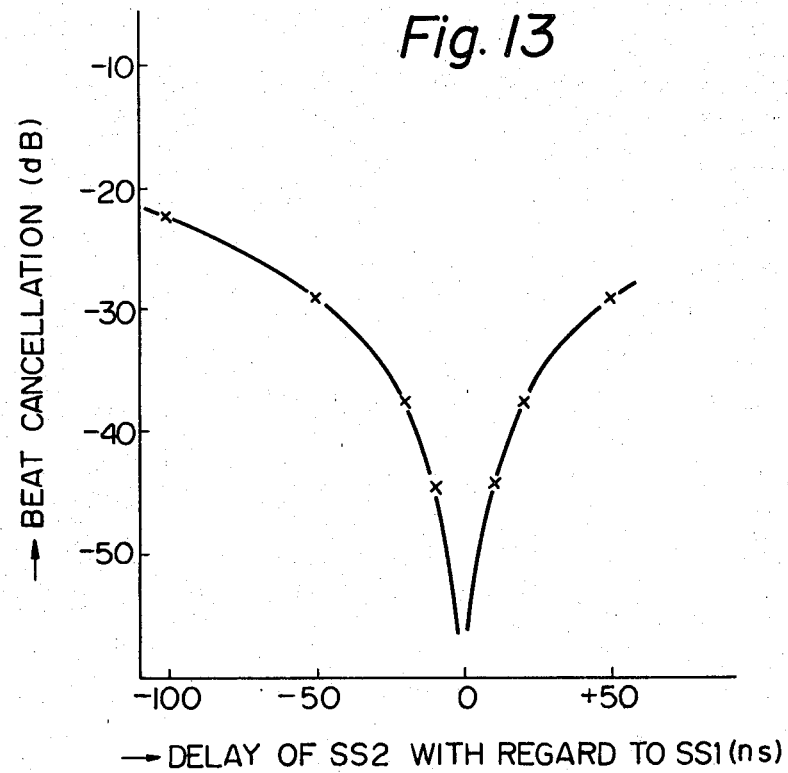
Fig.13

| | S | R | $Q_{n+1}$ | $\overline{Q_{n+1}}$ |
|---|---|---|---|---|
| SET-RESET FLIP-FLOP | O | O | x | x |
| | — | O | O | — |
| | O | — | — | O |
| | — | — | $Q_n$ | $\overline{Q_n}$ |

| | T | S | R | $Q_{n+1}$ | $\overline{Q_{n+1}}$ |
|---|---|---|---|---|---|
| D TYPE FLIP-FLOP | N.E. | O | O | $D_n$ | $\overline{D_n}$ |
| | P.E. | O | O | $Q_n$ | $\overline{Q_n}$ |
| | x | — | O | — | O |
| | x | O | — | O | — |
| | x | — | — | x | x |

| | T | S | R | $Q_{n+1}$ | $\overline{Q_{n+1}}$ |
|---|---|---|---|---|---|
| T TYPE FLIP-FLOP | N.E. | O | O | $\overline{Q_n}$ | $Q_n$ |
| | x | — | O | — | O |
| | x | O | — | O | — |

STEREO DEMODULATION SYSTEM FOR AN FM STEREO BROADCAST RECEIVER

TECHNICAL FIELD

The present invention relates to a stereo demodulation system for an FM stereo broadcast receiver. The stereo demodulation system according to the present invention is applicable to an FM stereo broadcast system of the pilot tone type using the subcarrier of 38 kHz.

BACKGROUND ART

It has been known that a stereo demodulation system for an FM stereo broadcast receiver incurs the problem of the generation of beat noise. When an FM stereo broadcast receiver which is receiving a broadcast wave transmitted by a desired broadcast station receives also another broadcast wave transmitted by an undesired broadcast station, the frequency difference between the two stations being, for example, 200 kHz and the maximum frequency deviation being 75 kHz, the frequency spectrum of the output of the FM detector can include an additional spectral range (ASR) illustrated as the hatched portion in the frequency spectrum of FIG. 4. When stereo demodulation is effected by using a signal having the frequency spectrum of FIG. 4 and the signal S(38) of 38 kHz, undesired components which cause unpleasant noise such as birdy-noise are produced due to the beats between the additional spectral range ASR (FIG. 4) and the odd higher harmonic frequency signal such as the third harmonic frequency signal S(114), and the fifth harmonic frequency signal S(190). If the frequency of the subcarrier signal is 38 kHz, the third and the fifth harmonic frequencies are 114 kHz and 190 kHz, respectively. Among such beat noises, the beat noise due to the third harmonic frequency S(114) is the first significant one and the beat noise due to the fifth harmonic S(190) is the second significant one.

A known prior art system is illustrated in FIG. 1 in which such beat noise is reduced by connecting a low pass filter 14, such as a beat-cut filter or an anti-birdy-noise filter between a receiving and detecting circuit 12 and a buffer amplifier 15. The FM stereo broadcast receiver of FIG. 1 comprises an antenna 11, the RF, IF amplification and FM detection stage 12, the low pass filter 14, a buffer amplifier 15, a capacitor 3, a phase comparator 4, a frequency divider 5, a low pass filter 61, a DC amplifier 62, a voltage controlled oscillator 7, a frequency divider 800, and a switch and decoder circuit 2. The decoder circuit 2 produces the demodulated left channel output (L) at the terminal 201 and right channel output (R) at the terminal 202. However, the system of FIG. 1 has a problem that the added low pass filter 14 exerts an undesirable effect on the ability of separating left and right channels of the stereo demodulation system and the frequency response characteristic of the demodulated output signal.

Improved prior art systems are illustrated in FIGS. 2 and 3 in which one signal, which is produced by switching the composite signal by a signal of a subcarrier frequency, and the other signal, which is produced by switching the composite signal by a signal of the third harmonic frequency of the subcarrier, are obtained, and addition and subtraction processes are effected between said one and the other signals, so that the beat noise is reduced. Such improved prior systems have been proposed by the inventors of the present invention in Japanese Patent Application No. 54-14230 (corresponding to U.S. Ser. No. 118,974, now U.S. Pat. No. 4,334,125).

The systems of FIGS. 2 and 3 comprise frequency dividing means 800 which includes frequency dividing flip-flop circuits 801, 802, 803, 804, a first switch and decoder circuit 21, a second switch and decoder circuit 22, and an addition/subtraction circuit 23. A first switching signal $SS_1$ produced from the frequency dividing means 800 is supplied to the first switch and decoder circuit 21, while a second switching signal $SS_2$ produced from the frequency dividing means 800 is supplied to the second switch and decoder circuit 22.

Since the principle of generation of the beat noise and the principle of the cancellation of the beat noise are described in the above referred preceding application, only a rough illustration of the analysis of the generation of the beat noise and the cancellation of the beat noise is shown in FIG. 4. Effecting the switching by the signal S(38) of 38 kHz, "L-R" signal is obtained in the demodulated signal. At the same time, a beat component BC(+) is formed by the multiplication of the additional spectral range ASR by the signal S(114) of 114 kHz. Also, effecting the switching by the signal S'(114) of 114 kHz which is opposite the signal S(114) a beat component BC(−) is formed by the multiplication of the additional spectral range ASR by the signal S'(114). Since the beat component BC(−) is of the same amount as that of the beat component BC(+) and has the opposite sign to that of the beat component BC(+), the beat components BC(+) and BC(−) are cancelled when the beat components are introduced into the addition/subtraction circuit 23.

However, in the circuit of, for example, FIG. 3, it is difficult to perfectly maintain the fixed phase relationship between the first and second switching signals $SS_1$, $SS_2$. The output signal $S_4$ of the flip-flop circuit 801 can have the wave form either of $S_4(A)$ or of $S_4(B)$ as illustrated in FIG. 5. That is, it is uncertain which signal whether a signal having wave form $S_4(A)$ or a signal having wave form $S_4(B)$ is produced as the output signal $S_4$ when the signal $S_1$ is applied to the input terminal of the flip-flop circuit 801. This uncertainty is caused by the inherent characteristic of a flip-flop circuit.

Assuming that the beat cancellation is carried out only when the relationship between the wave forms $S_1$ and $S_4$ is such that when the signal $S_1$ arises the signal $S_4$ falls, the signal $S_4$ having the wave form $S_4(B)$, achieves the cancellation of beat noise, while the signal $S_4$, having the wave form $S_4(A)$, cannot cancel beat noise but even doubles the beat noise. This constitutes problems in the system of FIG. 3.

SUMMARY OF THE INVENTION

It is the main object of the present invention to maintain the fixed phase relationship between the first and the second switching signals, enhance the capacity of the elimination of the beat noise due to the third harmonic frequency of the subcarrier and accordingly solve the above described problems in the prior art systems.

It is also an object of the present invention to eliminate the beat noise due to the fifth harmonic frequency of the subcarrier.

In accordance with the main feature of the present invention, there is provided a stereo demodulation system for an FM stereo broadcast receiver in which a signal for switching and decoding the received stereo composite signal is produced in a demodulator, said system comprising: a voltage controlled oscillator which produces a signal of a specific frequency ($f_{vco}$), frequency dividing means for receiving the output signal of said voltage controlled oscillator and producing a first switching signal of 1/m frequency ($f_{vco}$/m) of said specific frequency and a second switching signal of 1/l frequency ($f_{vco}$/l) of said specific frequency, a phase comparator for phase comparing a further frequency divided signal of said first switching signal with a pilot signal contained in the received stereo composite signal, a low pass filter for filtering the output signal of said phase comparator and feeding back to said voltage controlled oscillator so that said voltage controlled oscillator, said phase comparator and a low pass filter constituting a phase locked loop, a first switch and decoder circuit for switching and decoding said stereo composite signal by said 1/m frequency ($f_{vco}$/m) signal produced from said frequency dividing means, a second switch and decoder circuit for switching and decoding said stereo composite signal by an output signal of 1/l frequency ($f_{vco}$/l) of said predetermined frequency produced from said frequency dividing means, and an addition and subtraction circuit for adding and subtracting the output signals of said first and second switch and decoder circuit so that the signal component in the output signal of said first switch and decoder circuit, which component is a product of the harmonic frequency component of the subcarrier signal and the stereo composite signal, is cancelled by the signal component in the output signal of said second switch and decoder circuit, which component is a product of the fundamental frequency component of the switching signal and the stereo composite signal, characterized in that: said first switching signal of 1/m frequency ($f_{vco}$/m) and said second switching signal of 1/l frequency ($f_{vco}$/l) are produced from said frequency dividing means with a predetermined phase relationship between said first and second switching signals.

BRIEF DESCRIPTION OF THE DRAWINGS

FIG. 13 illustrates the effect of the beat cancellation in connection with the system of FIG. 10.

DESCRIPTION OF THE PREFERRED EMBODIMENTS

Figure 1:
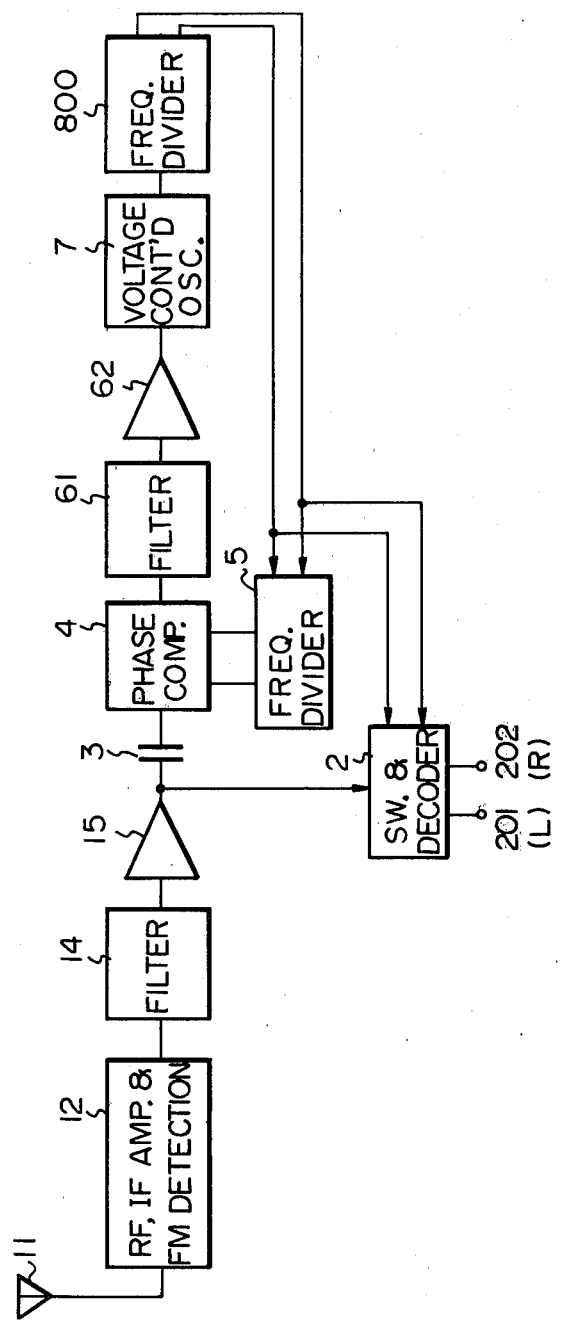
FIGS. 1, 2 and 3 illustrate the three types of the prior art stereo demodulation system for an FM stereo broadcast receiver.
Figure 2:
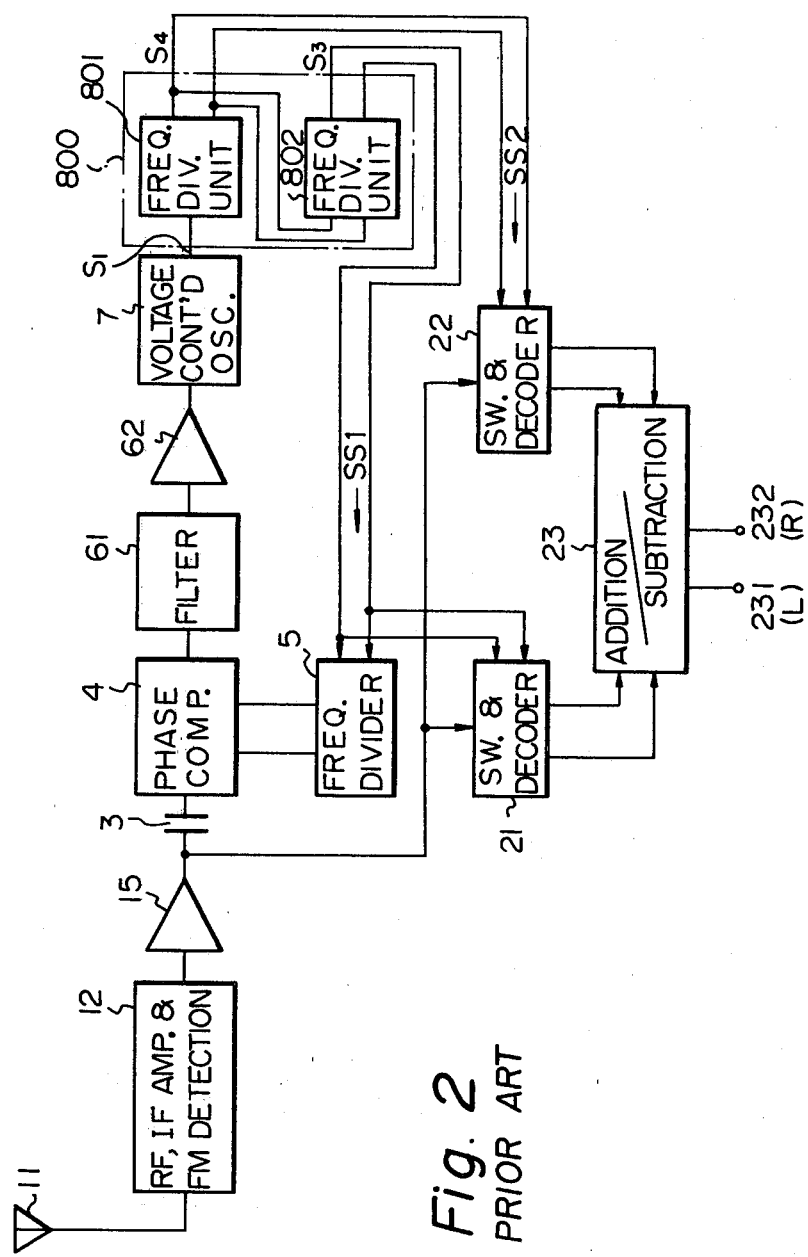
Figure 3:
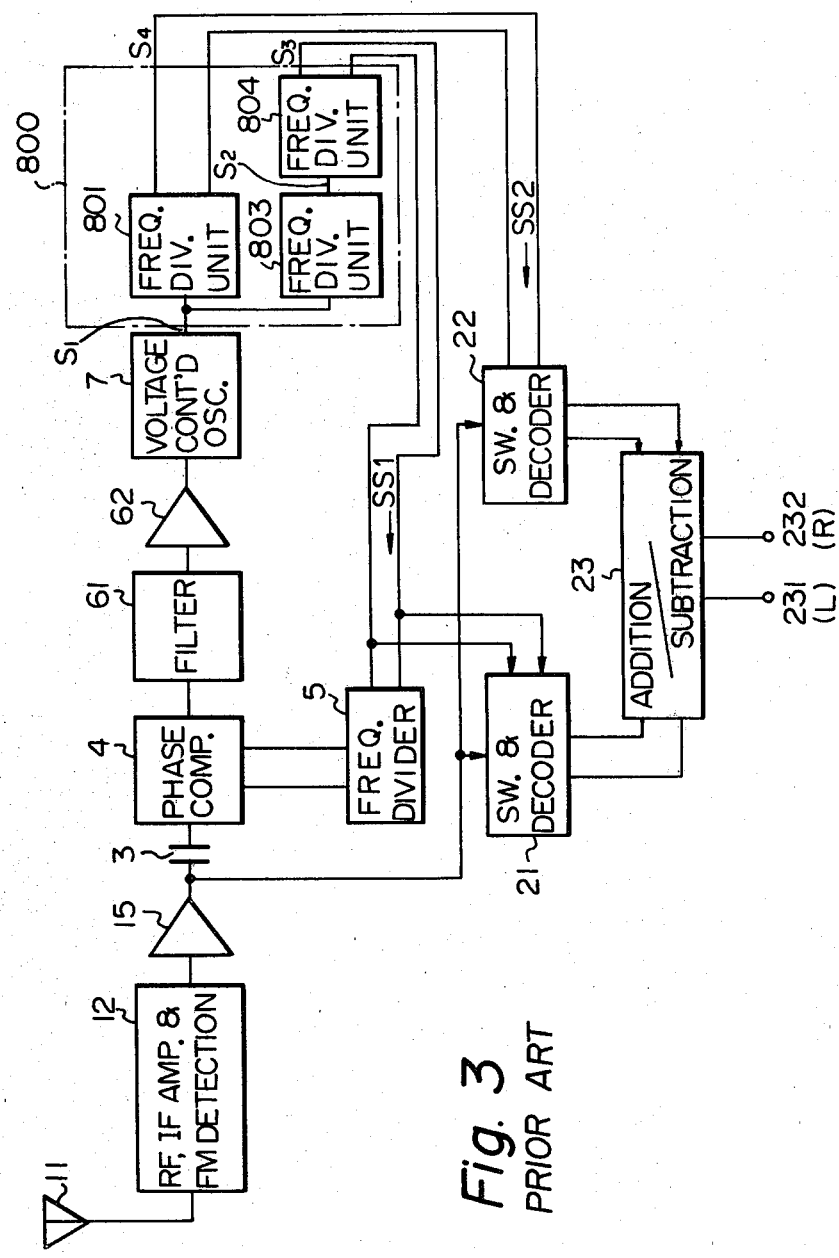
Figure 4:
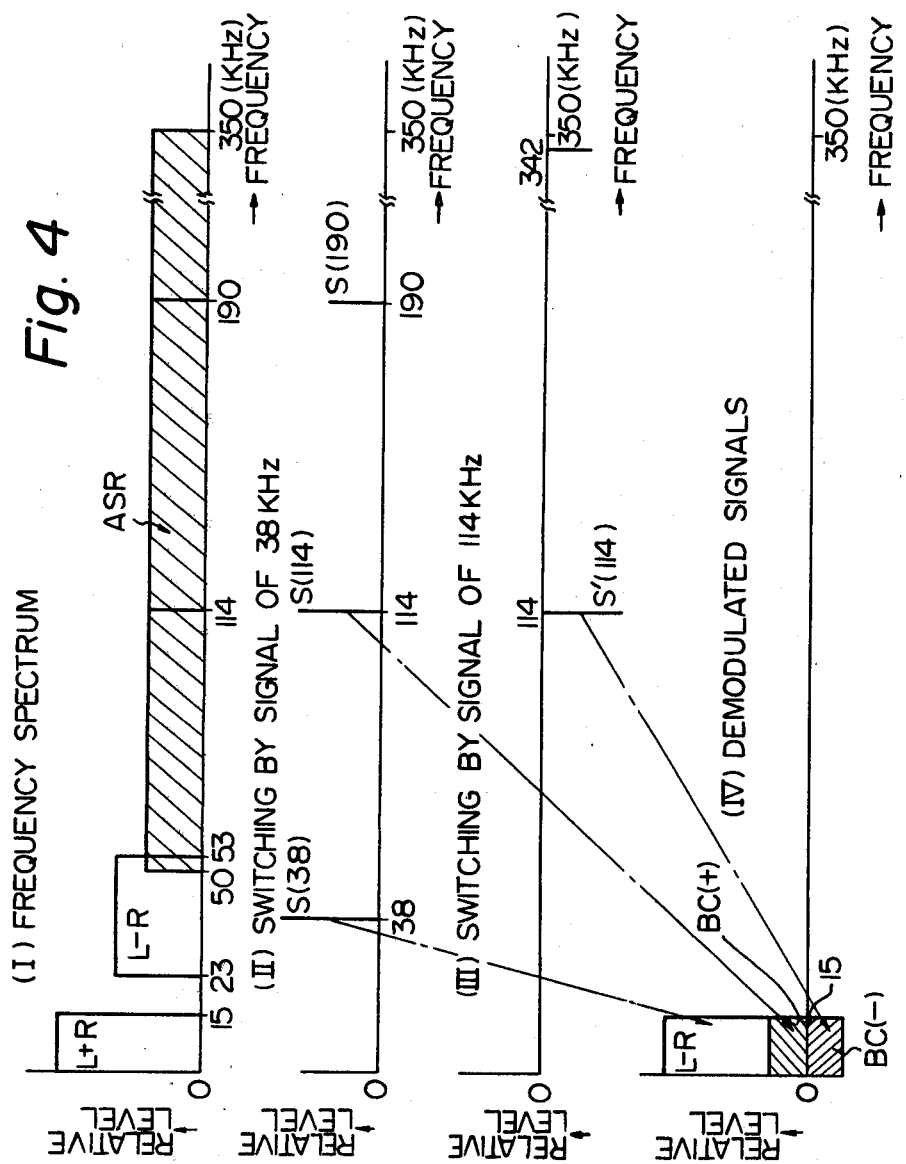
FIG. 4 illustrates the principle of generation of the beat noise and the principle of the cancellation of the beat noise.
Figure 5:
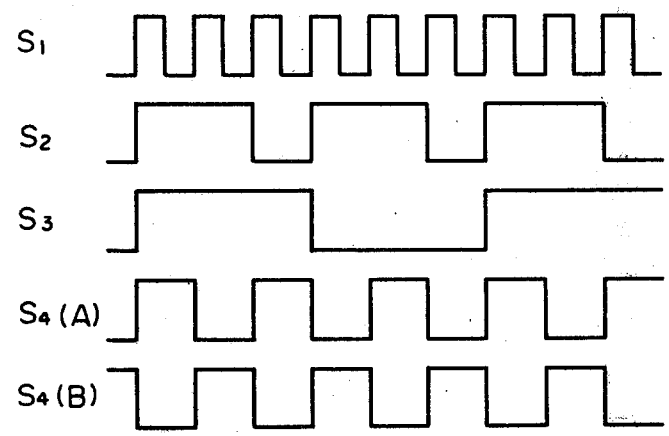
FIG. 5 illustrates the operation of the system of FIG. 3.
Figure 6B:
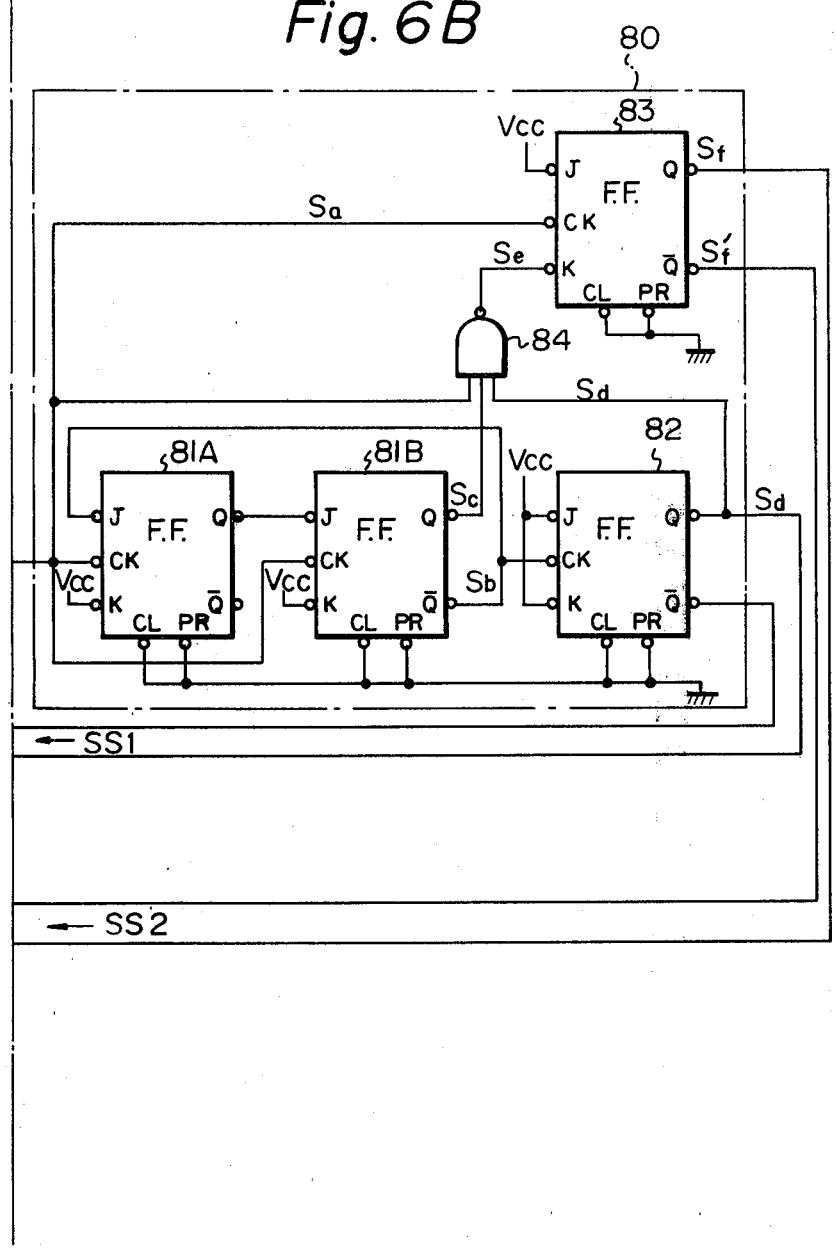
FIG. 6 illustrates the connection of FIGS. 6A and 6B, FIGS. 6A and 6B illustrate a stereo demodulation system for an FM stereo broadcast receiver in accordance with an embodiment of the present invention.

A stereo demodulation system in accordance with an embodiment of the present invention is illustrated in FIGS. 6A and 6B. The FM stereo broadcast receiver comprises an FM antenna 11, an RF amplification-local oscillation-mixing-FM detection device 12, a buffer amplifier 15, a capacitor 3, a phase comparator 4, a frequency divider 5, a low pass filter 61, a DC amplifier 62, a voltage controlled oscillator 7, a frequency dividing means 80, a first switch and decoder circuit 21, a second switch and decoder circuit 22, and an addition/subtraction circuit 23. In the addition/subtraction circuit 23, addition is effected when the two input signals are in phase, while subtraction is effected when the two signals are opposite phase.

In FIGS. 6A and 6B, the voltage controlled oscillator 7, the phase comparator 4, the low pass filter 61, the DC amplifier 62 constitute a phase locked loop. The voltage controlled oscillator 7 receives the output of the DC amplifier and produces a signal of a specific frequency $f_{vco}$. The frequency dividing means 80 receives said output $f_{vco}$ of said voltage controlled oscillator 7 and produces a first switching signal $SS_1$ and a second switching signal $SS_2$. If $f_{vco}$ is 228 kHz, the frequency of SS$_1$ is 38 kHz which is one-sixth of f$_{vco}$ and the frequency of SS$_2$ is 114 kHz which is half of f$_{vco}$.

The phase comparator 4 compares the output of the frequency divider 5 and the pilot signal contained in the incoming stereo composite signal SCS through the capacitor 3. The first switch and decoder circuit 21 switches and decodes the incoming stereo composite signal SCS by using the first switching signal SS$_1$. The second switch and decoder circuit 22 switches and decodes the incoming stereo composite signal SCS by using the second switching signal SS$_2$. The addition/subtraction circuit 23 effects addition or subtraction between the output of the first switch and decoder circuit 21 and the output of the second switch and decoder circuit 22. Thus, the demodulated FM stereo signal for the left channel is obtained at one 231 of the output terminals, while the demodulated FM stereo signal for right channel is obtained at the other 232 of the output terminals.

The signal component in the output signal of the first switch and decoder circuit 21, which component is a product of high harmonic frequency component of the subcarrier signal and the stereo composite signal, and the signal component in the output signal of the second switch and decoder circuit 22, which component is a product of the fundamental frequency component of the switching signal and stereo composite signal, which cancel each other.

In the system of FIGS. 6A and 6B, the frequency dividing means 80 comprises a set of first frequency divider units 81A, 81B, a set of second frequency divider units 82, 83, and a logic unit 84. Said set of first frequency divider unit 81A, 81B divides the supplied frequency into one-third of the supplied frequency. Each of said second frequency divider units 82, 83 divides the supplied frequency into half of the supplied frequency.

Figures 7A, 7B:
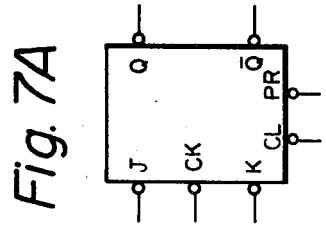
FIGS. 7A and 7B illustrate the symbol and the truth table of the operation of the flip-flop circuit used in the system of FIGS. 6A and 6B.

Each of the frequency divider units is a positive edge triggering type J-K master-slave flip-flop circuit illustrated in FIG. 7A. The truth table of the operation of said flip-flop circuit is shown in FIG. 7B. In the chart, "CL" is clear input, "PR" is preset input, "CK" is clock input, Q$_n$ and $\overline{Q}_n$ are Q and $\overline{Q}$ output signals at a given time point t$_n$, $\overline{Q}_{n+1}$ are Q and $\overline{Q}$ output signals and the next time point t$_{n+1}$, "P.E." is positive edge, "N.E." is nagative edge, "1" is HIGH potential, "0" is LOW potential, and "X" is the situation: "regardless of being '1' or '0'". The output Sa of the voltage controlled oscillator 7, the Q potential Sc of the flip-flop 81B and Q potential Sd of the flip-flop 82 are supplied to the NAND gate 84. The output Se of the NAND gate 84 is supplied to the K input terminal of the flip-flop circuit 83. It should be noted that the potential Se is definitely produced once in each cycle of 38 kHz.

If LOW level of the potential Se is supplied to the K input terminal of the flip-flop circuit 83, the Q potential Sf of the flip-flop circuit 83 becomes HIGH, because HIGH potential is supplied to J input terminal, LOW potential is supplied to K input terminal and a positive edge of the wave form Sa is supplied to CK input terminal (See State No. 6 of FIG. 7B). After that, if the potential Se supplied to the K input terminal of the flip-flop circuit 83 becomes HIGH, the Q potential Sf of the flip-flop circuit 83 is caused to be inverted.

Thus, at the moment that the wave form Sd rises at its positive edge, the wave form Sf' falls at its negative edge, and at the moment that the wave form Sd falls at its negative edge, the wave form Sf' rises at its positive edge, so that the rise and fall of the wave form Sd correspond to the fall and rise of the wave form Sf', respectively. This means that the switching signal SS$_1$ of 38 kHz is in phase with the switching signal SS$_2$ of 114 kHz. Accordingly, in the system of FIG. 6, the desirable phase relationship between the signal Sd and the signal Sf' is ensured. The relationships between the signals Sa, Sb, Sc, Sd, Se, Sf and Sf' are illustrated in FIG. 8.

In the above description concerning the system of FIGS. 6A and 6B, f$_{vco}$ was assumed to be 228 kHz. However, f$_{vco}$ can also be assumed to be other than 228 kHz, for example to be 456 kHz. If f$_{vco}$ is assumed to be 456 kHz, the frequency 38 kHz of SS$_1$ should be one twelfth of f$_{vco}$ and the frequency 114 kHz of SS$_2$ should be one fourth of f$_{vco}$. Thus, the value m is 6 for f$_{vco}$ of 228 kHz and 12 for f$_{vco}$ of 456 kHz, and the value l is 2 for f$_{vco}$ of 228 kHz and 4 for f$_{vco}$ of 456 kHz.

In the description of the system of FIGS. 6A and 6B, the problem of the transmission time delay in the elements of the frequency dividing means is not taken into account. However, in practice, there exists a transmission time delay in the elements of the frequency dividing means as illustrated in FIG. 9.

Figure 8:
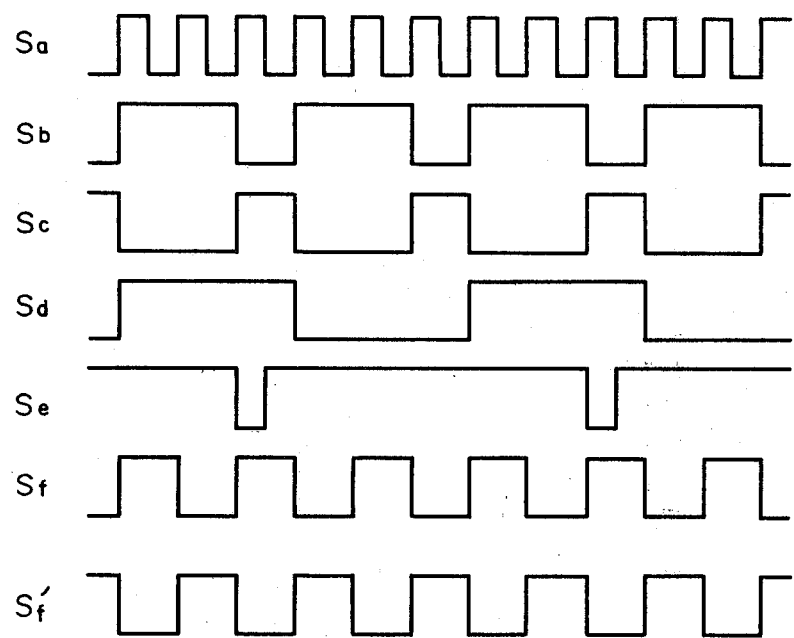
FIG. 8 illustrates the operation of the system of FIGS. 6A and 6B.
Figure 9:
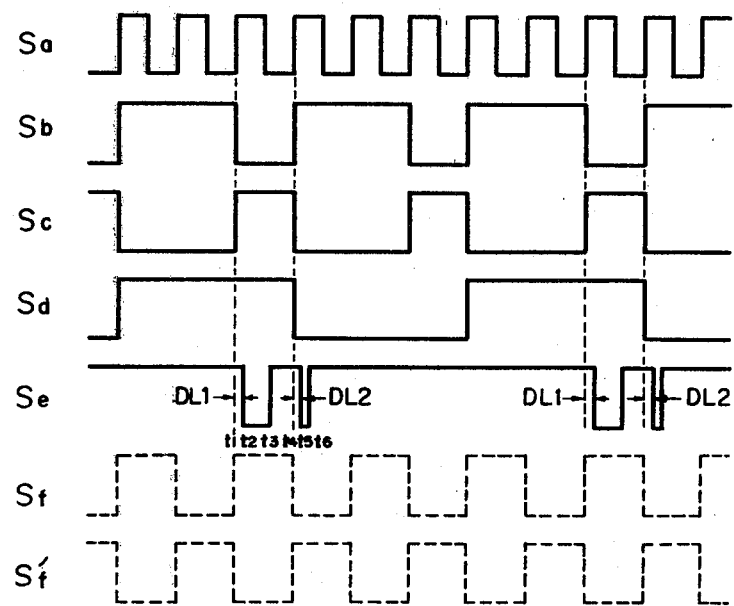
FIG. 9 illustrates the problem in the operation of the system of FIGS. 6A and 6B.

Because of the transmission delay in the flip-flop circuits 81A, 81B and 82 and the logic unit 84, the wave form of the signal Se of FIG. 8 should be changed into that of FIG. 9. If the signal Se of FIG. 9 is supplied to the K input terminal of the flip-flop circuit 83, the phase of the output signal of the flip-flop circuit 83 is not fixed, because the signal Se falls at t$_2$ which is delayed by DL$_1$ with regard to the rise of the signal Sa at t$_1$.

In order to produce the output signals of State Number 6 of FIG. 7B in the flip-flop circuit 83, it is necessary to maintain a predetermined set-up time between the application of J, K inputs and the application of the signal Sa as CK input. However, although the fall of the signal Se at t$_5$ is delayed (DL$_2$) from the rise of the signal Sa at t$_4$, the delay DL$_2$ is not as long as the predetermined set-up time. In order to solve the above described problem, the systems of FIGS. 10, 14, 16 and 18 are now proposed as modified embodiments of the present invention.

Figure 10:
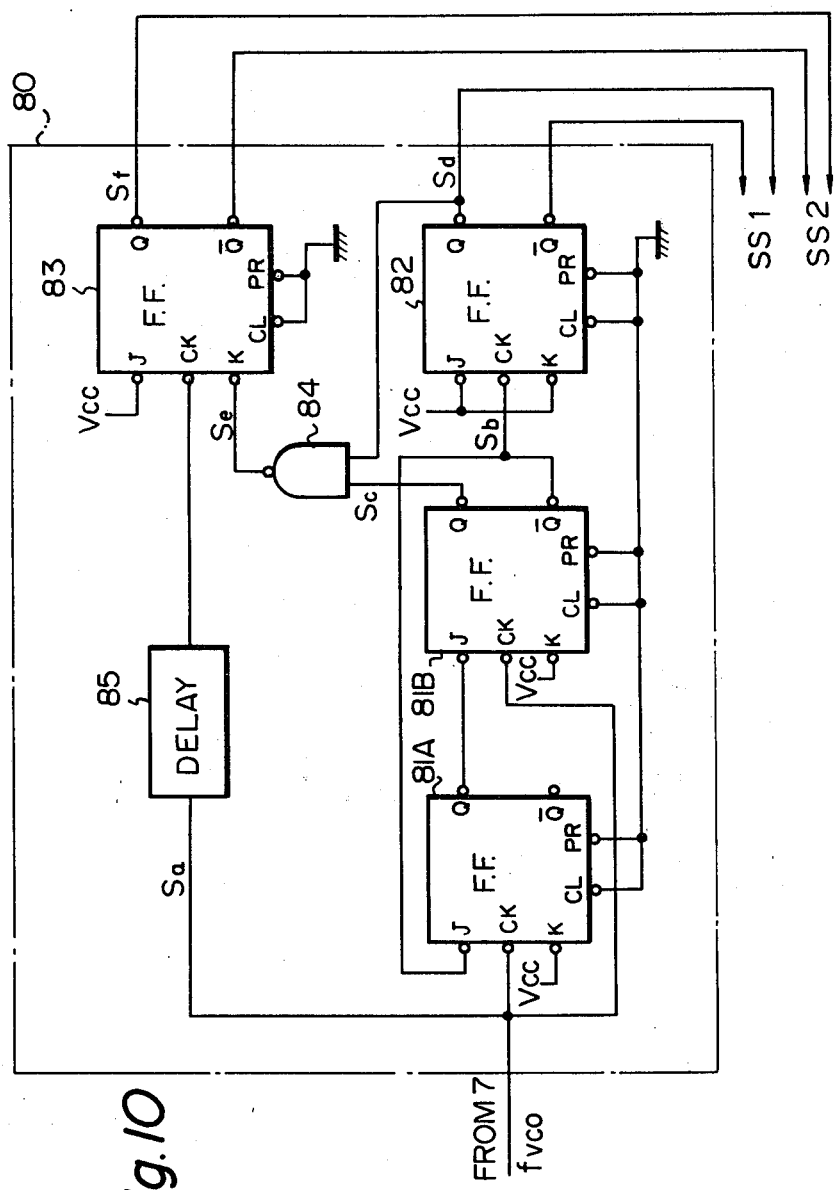
FIG. 10 illustrates a frequency dividing means of a stereo demodulation system in accordance with a modified embodiment of the present invention.
Figure 11:
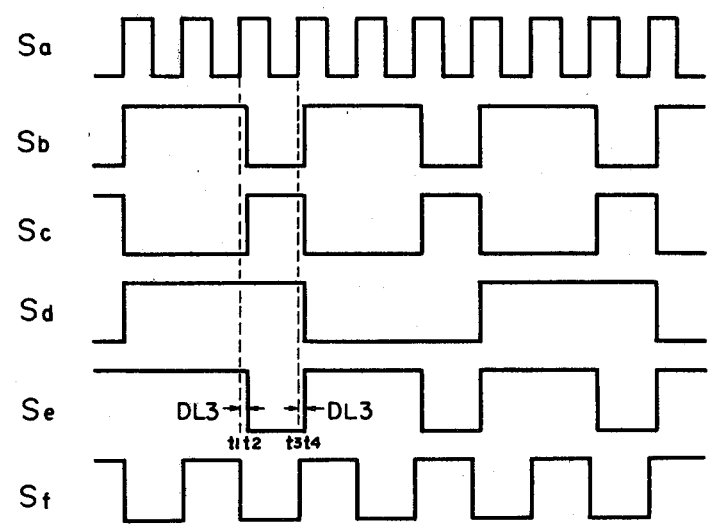
FIG. 11 illustrates the operation of the system of FIG. 10, FIGS. 12A, 12B and 12C illustrate examples of the structures of the time delay circuit in the system of FIG. 10.

In the system of FIG. 10, a time delay circuit 85 is connected between the output terminal of the voltage controlled oscillator 7 and the CK input terminal of the flip-flop circuit 83. The operation of the system of FIG. 10 is illustrated in FIG. 11. The delay time DL$_3$, which is the period from the rise of the signal Sa to the fall of the signal Se, is the sum of the transmission delay time of the flip-flop circuits 81A, 81B, 82 and the logic unit 84. The delay time of the time delay circuit 85 is equal to the time difference between the signal Sa and the signal Sb, taking into consideration the time difference between the application of a signal to CK input and the delivery of a signal from the output terminal of the flip-flop circuit 82 which is equal to that of the flip-flop circuit 83.

A time delay circuit consisting of a set of logic units 851 and 852 (FIG. 12A, FIG. 12B), or a CR delay circuit having a capacitor 853 and a resistor 854 (FIG. 12C) can be used for the time delay circuit 85 of FIG. 10.

The time relationship difference between the signal of 38 kHz (Sd) and the signal of 114 kHz (Sf) and the deterioration of the beat cancellation effect (dB) is illustrated in FIG. 13. It is observed that, it is necessary to reduce as much as possible the time difference between the above mentioned signals in order to enhance the effect of beat cancellation.

Figure 14:
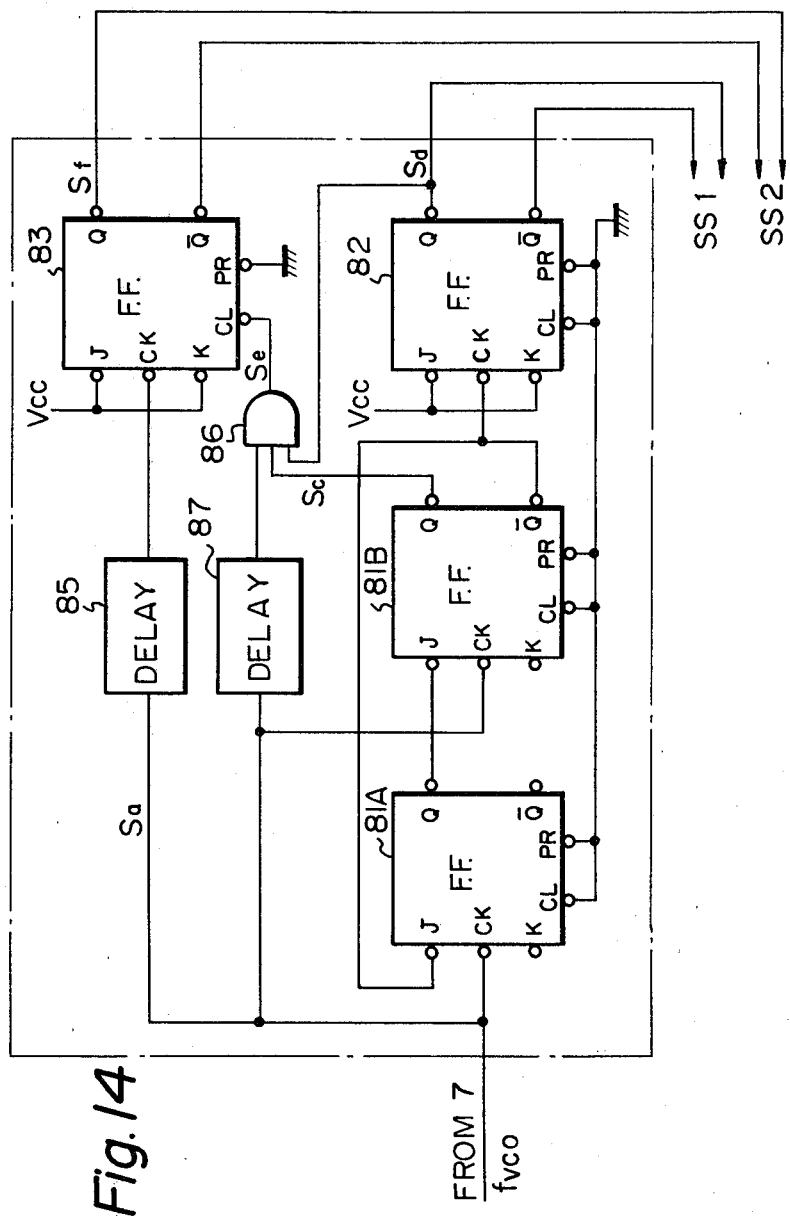
FIG. 14 illustrates a frequency dividing means of a stereo demodulation system in accordance with another modified embodiment of the present invention.
Figure 15:
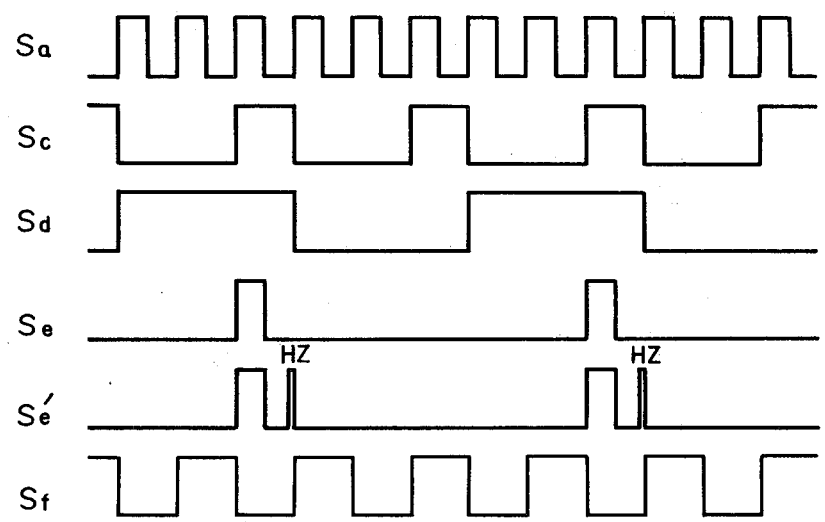
FIG. 15 illustrates the operation of the system of FIG. 14.

In the system of FIG. 14, a time delay circuit 85 is connected between the output terminal of the voltage controlled oscillator 7 and the CK input terminal of the flip-flop circuit 83, and a time delay circuit 87 is connected between the output terminal of the voltage controlled oscillator 7 and an AND gate 86. Q output of the flip-flop circuit 81B, Q output of the flip-flop circuit 82 and the output of the time delay circuit 87 are supplied to the AND gate 86. The output of the AND gate 86 is supplied to the CL input terminal of the flip-flop circuit 83. The operation of the system of FIG. 14 is illustrated in FIG. 15. Receiving the signal Se at the CL input terminal, the flip-flop circuit 83 produces the signal Sf so that the positive portions of the wave form of the signal Se casing the wave form of the signal Sf to be positive. Thus the phase relationship between the signals Sd and Sf is fixed. The time delay circuit 87 prevents the wave form of the signal Se from producing the hazard HZ as illustrated in the wave form Se' of FIG. 15.

Figure 16:
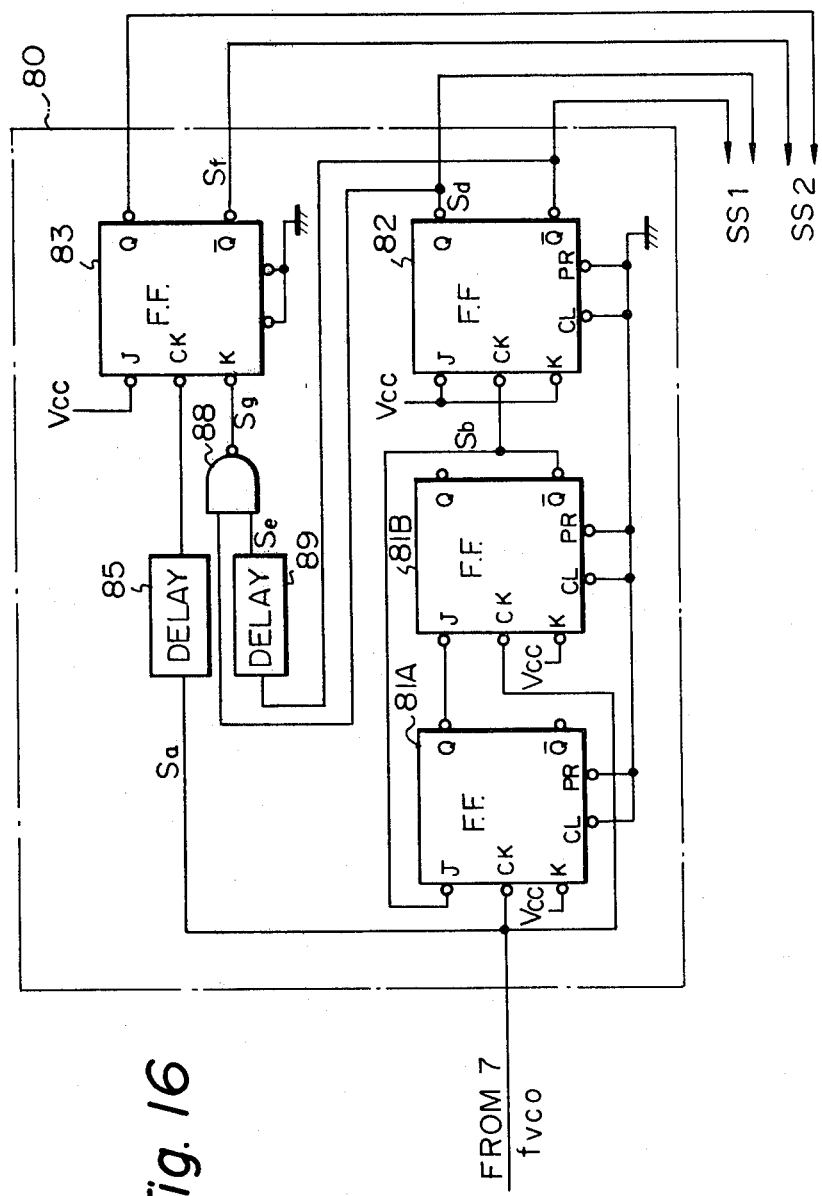
FIG. 16 illustrates a frequency dividing means of a stereo demodulation system in accordance with another modified embodiment of the present invention.
Figure 17:
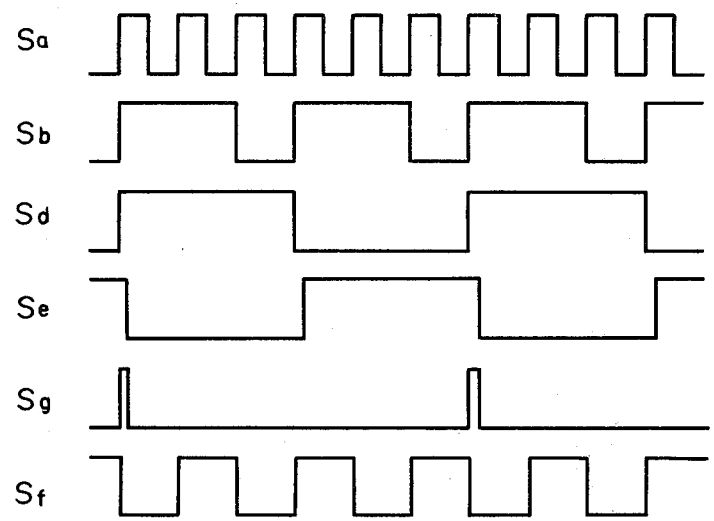
FIG. 17 illustrates the operation of the system of FIG. 16.

In the system of FIG. 16, a time delay circuit 85 is connected between the output terminal of the voltage controlled oscillator 7 and the CK input terminal of the flip-flop circuit, and a time delay circuit 89 is connected between the $\overline{Q}$ output terminal of the flip-flop circuit 82 and a NAND gate 89. Q output of the flip-flop circuit 82 and the output of the time delay circuit 89 are supplied to the NAND gate 88. The output of the NAND gate 88 is supplied to the K input terminal of the flip-flop circuit 83. The operation of the system of FIG. 16 is illustrated in FIG. 17.

Figure 19:
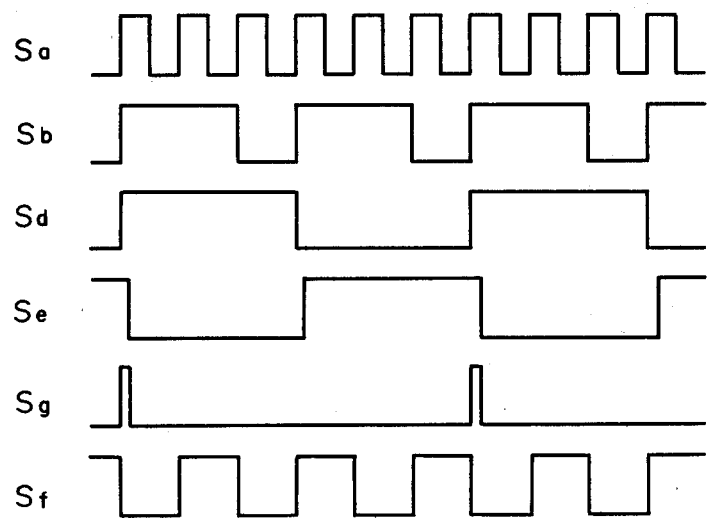
FIG. 19 illustrates the operation of the system of FIG. 18.
Figure 18:
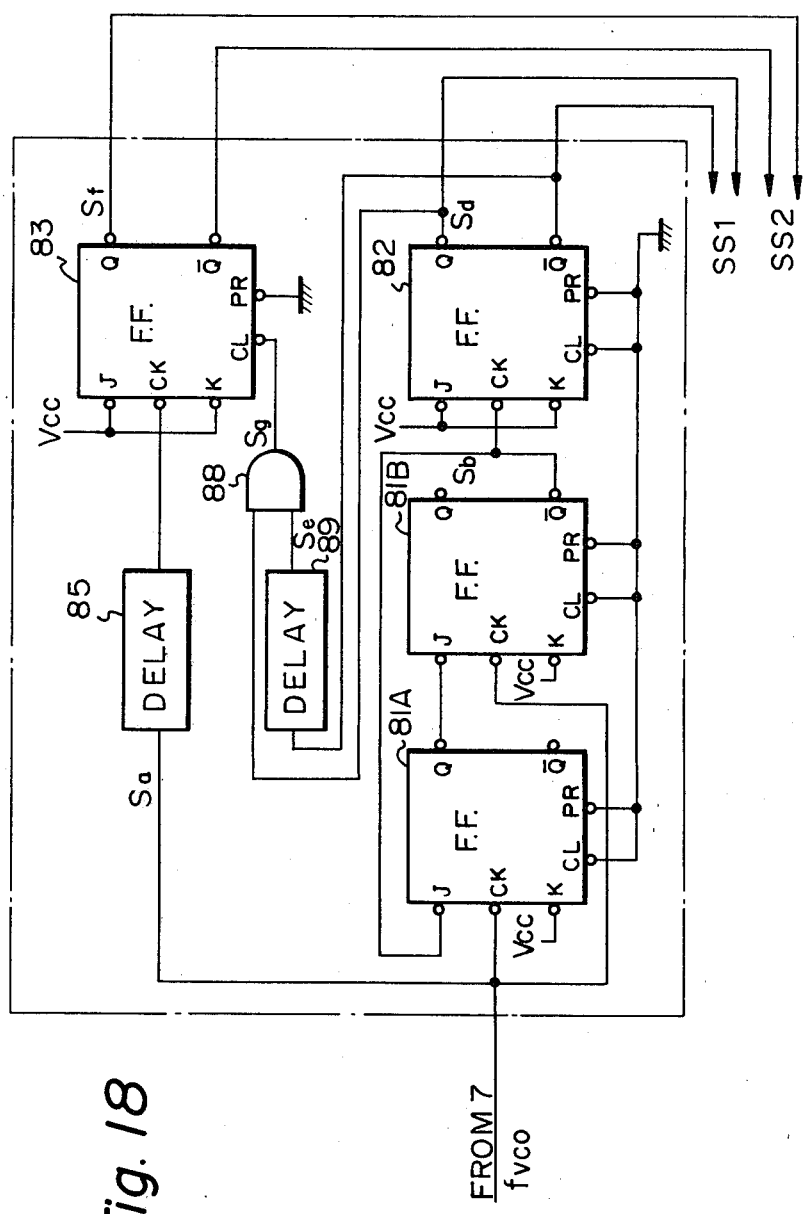
FIG. 18 illustrates a frequency dividing means of a stereo demodulation system in accordance with another modified embodiment of the present invention.

In the system of FIG. 18, a time delay circuit 85 is connected between the output terminal of the voltage controlled oscillator 7 and the CK input terminal of the flip-flop circuit, and a time delay circuit 89 is connected between the $\overline{Q}$ output terminal of the flip-flop circuit 82 and an AND gate 88. Q output of the flip-flop circuit 82 and the output of time delay circuit 89 are supplied to the AND gate 88. The output of the AND gate 88 is supplied to the CL input terminal of the flip-flop circuit 83. The operation of the system of FIG. 18 is illustrated in FIG. 19.

Figure 20:
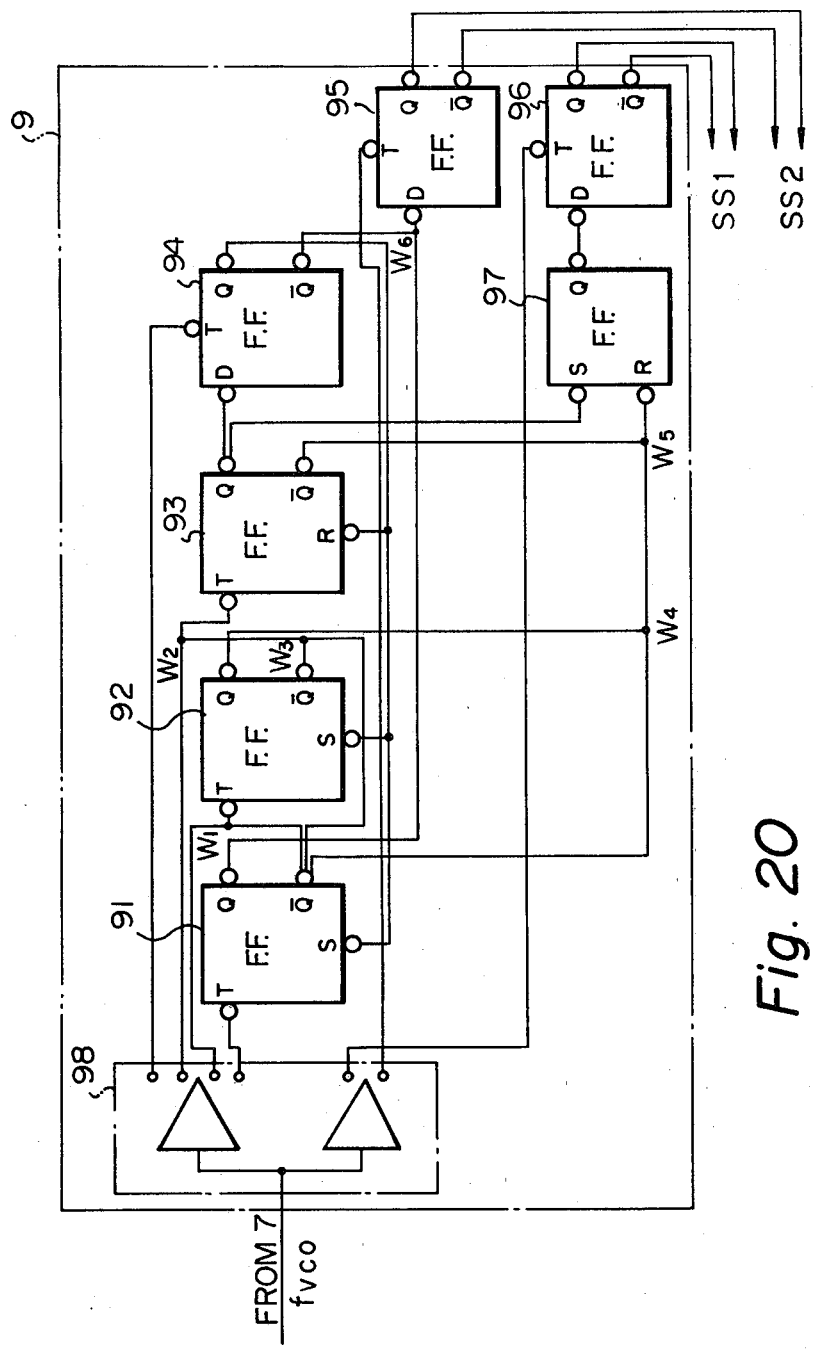
FIG. 20 illustrates a frequency dividing means of a stereo demodulation system in accordance with another modified embodiment of the present invention.
Figure 21C:
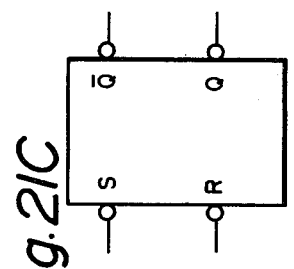
FIGS. 21A, 21B and 21C illustrate the symbols and the truth tables of the flip-flop circuits in the frequency dividing means of FIG. 20, FIGS. 22A, 22B and 22C illustrate the wired AND operation of a SET-RESET flip-flop circuit in the frequency dividing means of FIG. 20.
Figure 21B:
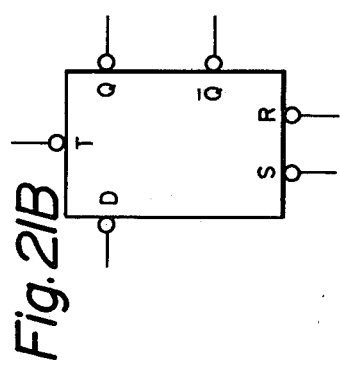
Figure 21A:
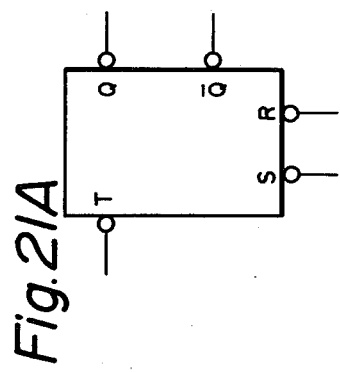

Another embodiment of a frequency dividing means 9 used for the system in accordance with the present invention is illustrated in FIG. 20. The frequency dividing means 9 comprises a transistor buffer circuit 98, T type flip-flop circuits 91, 92, 93, D type flip-flop circuits 94, 95, 96, and a SET-RESET flip-flop circuit 97. Each of these T type, D type and SET-RESET flip-flop circuits is constructed, for example, in the form of the integrated injection logic ($I^2L$). Also, it is possible to adopt the construction in the form of TTL or C-MOS. The symbols and the truth tables of the T type, D type and SET-RESET flip-flop circuits used in the frequency dividing means 9 are illustrated in FIGS. 21A, 21B and 21C, respectively. In the truth table, "T", "S" and "R" are T-input, SET input and RESET input, respectively, "Dn" is the state "1" or "0" of D input at a given time point $t_n$, "$\overline{D_n}$" is the inverse state of the "$D_n$", and "*" is an unfixed state. The meaning of the other symbols in FIGS. 21A, 21B and 21C are the same as those in FIG. 7B.

Figure 22A:
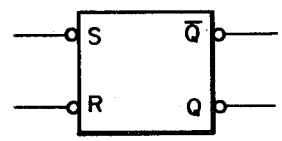
Figure 22B:
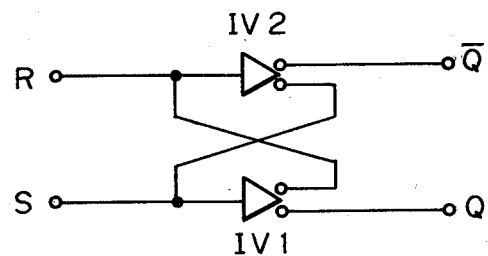
Figure 22C:
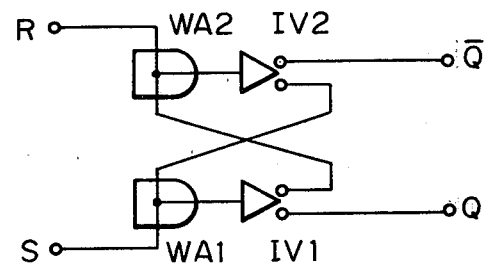

In the circuit of FIG. 20, the connecting points $W_1$, $W_2$, $W_4$, $W_5$ and $W_6$ are the connecting points at which the wired AND operation is carried out. As an example, the wired AND operation of a SET-RESET flip-flop circuit is illustrated in FIGS. 22A, 22B and 22C. A SET-RESET flip-flop of FIG. 22A is represented as a circuit of FIG. 22B comprising inverters IV1 and IV2. The circuit of FIGS. 22B is further represented as a circuit of FIG. 22C comprising wired AND units WA1 and WA2 and inverters IV1 and IV2. In the circuit of FIG. 22C, when S is "1" and R is "0", both S and $\overline{Q}$ equal "1", and hence the output of the wired AND unit WA1 becomes "1", and then the output of the inverter IV1 becomes "0", and then the Q output becomes "0". At that time, since both R and Q are equal to zero, the output of the wired AND unit $A_2$ becomes "0", and hence the output of the inverter IV2 becomes "1". Accordingly, the truth table of the operation of a SET-RESET flip-flop circuit shown in FIG. 21C is obtained.

The ouput signal of 228 kHz of the voltage controlled oscillator is supplied to the input terminal of the transistor buffer circuit 98. The T type flip-flop circuits 91, 92 and 93 and the D type flip-flop circuit constitute a one-sixth frequency divider with a one-sixth duty cycle.

Figure 23:
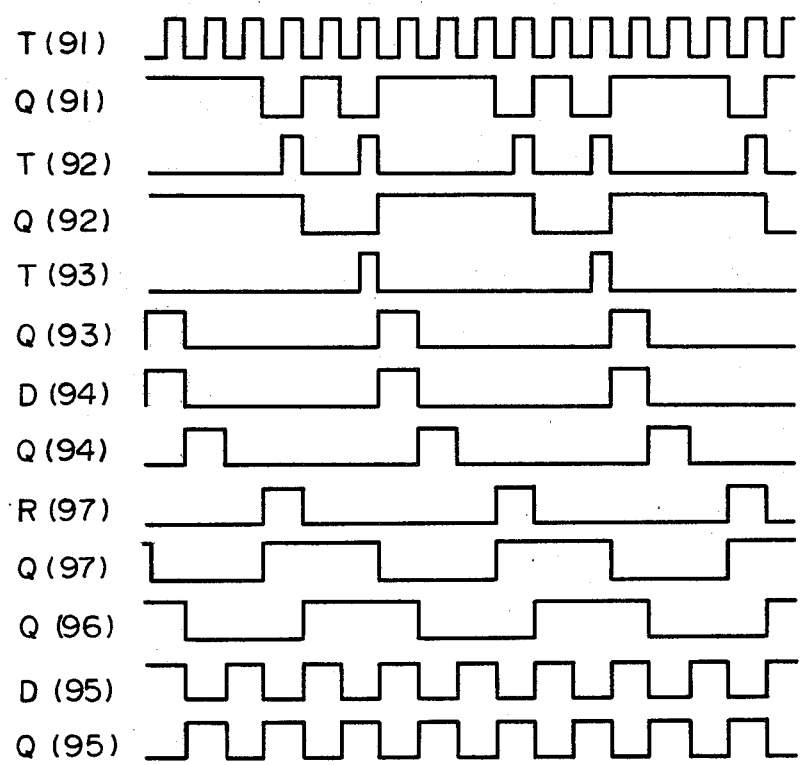
FIG. 23 illustrates the operation of the system of FIG. 20.

The waveforms of the signals existing in portions of the circuit of FIG. 20 are illustrated in FIG. 23. The output of the T type flip-flop circuit 93 is expressed as a wave form Q(93) with a one-sixth duty cycle. The signal R(97) is produced as the result of AND processes by the wired AND points $W_4$ and $W_5$ where the AND processes of the $\overline{Q}$(91), Q(92) and $\overline{Q}$(93) are carried out. The pulse of the signal R(97) is a pulse of a one-sixth duty cycle and is of the phase which is different by 180° from that of the signal Q(93). Receiving the signals Q(93) and R(97), the SET-RESET flip-flop circuit 97 produces a one-sixth frequency divided signal Q(97) of a fifty per cent duty cycle.

The signal D(95) is produced as the result of the AND process by the wired AND point $W_6$ where the AND process of Q(91) and $\overline{Q}$(94) is carried out. Thus the signals Q(97) and D(95) are the signals of 38 kHz and 114 kHz having a fixed phase relationship. Receiving Q(97) output from the SET-RESET flip-flop circuit 97 and T(96) input from the transistor buffer 98, the D type flip-flop circuit 96 produces Q(96) output of 38 kHz. Receiving D(95) input from the wired AND point $W_6$ and T(95) input from the transistor buffer 98, the D type flip-flop circuit produces Q(95) output of 114 kHz. Thus, the produced signals Q(96) and Q(95) are signals with no time delay, that is signals of the synchronized type. Also, the rise and fall of the wave form Q(96) correspond to the fall and rise of the wave form Q(95), respectively. This means the switching signal $SS_1$ of 38 kHz is in phase with the switching signal $SS_2$ of 114 kHz as in the circuit of the hereinbefore described embodiment of FIGS. 6A and 6B.

Compared with the embodiment of FIGS. 6A and 6B in which the variance between the first and second switching signals is four times the transmission delay time of one J-K master-slave flip-flop circuit, the variance between the first and second switching signals in the embodiment of FIG. 20 is two times that of the transmission delay time of one D type flip-flop circuit. As the transmission delay time of one D type flip-flop circuit is about a half of that of one J-K master-slave flip-flop circuit, the variance between the first and second switching signals of the embodiment of FIG. 20 is reduced to one-fourth of that of the embodiment of FIGS. 6A and 6B.

Figure 24:
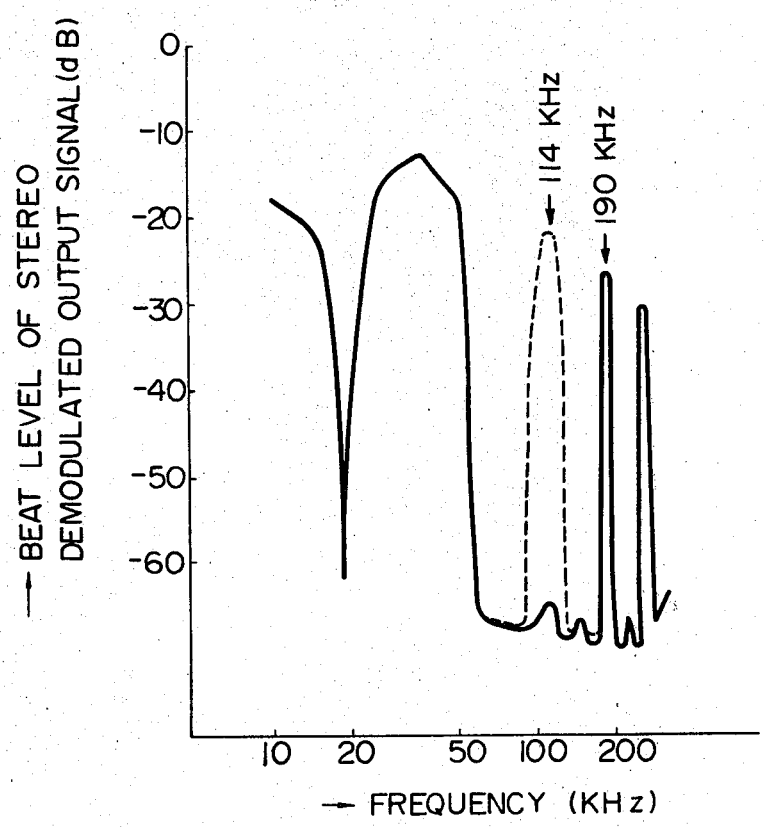
FIG. 24 illustrates the characteristics of the existence of the beat noise due to the fifth harmonic frequency of the subcarrier.

The description described hereinbefore relates to the elimination of the beat noise due to the third harmonic frequency of the subcarrier. Hereinafter, the problem of the beat noise due to the harmonic frequency of the subcarrier will be discussed. FIG. 24 illustrates the relationship between the frequency of the received signal in kHz the beat level of the stereo demodulated output signal in dB.

By using any one of the embodiments illustrated in FIGS. 6A, 6B, 10, 14, 16, 18 and 20, the beat level characteristic shown by the solid line in FIG. 24 is obtained. It is observed that the beat peak at the third harmonic frequency 114 kHz has been eliminated. The eliminated beat peak is illustrated by the broken line. However, in FIG. 25, it is also observed that the beat peaks at the fifth harmonic frequency 190 kHz and the seventh harmonic frequency 266 kHz have not been eliminated.

Figure 25:
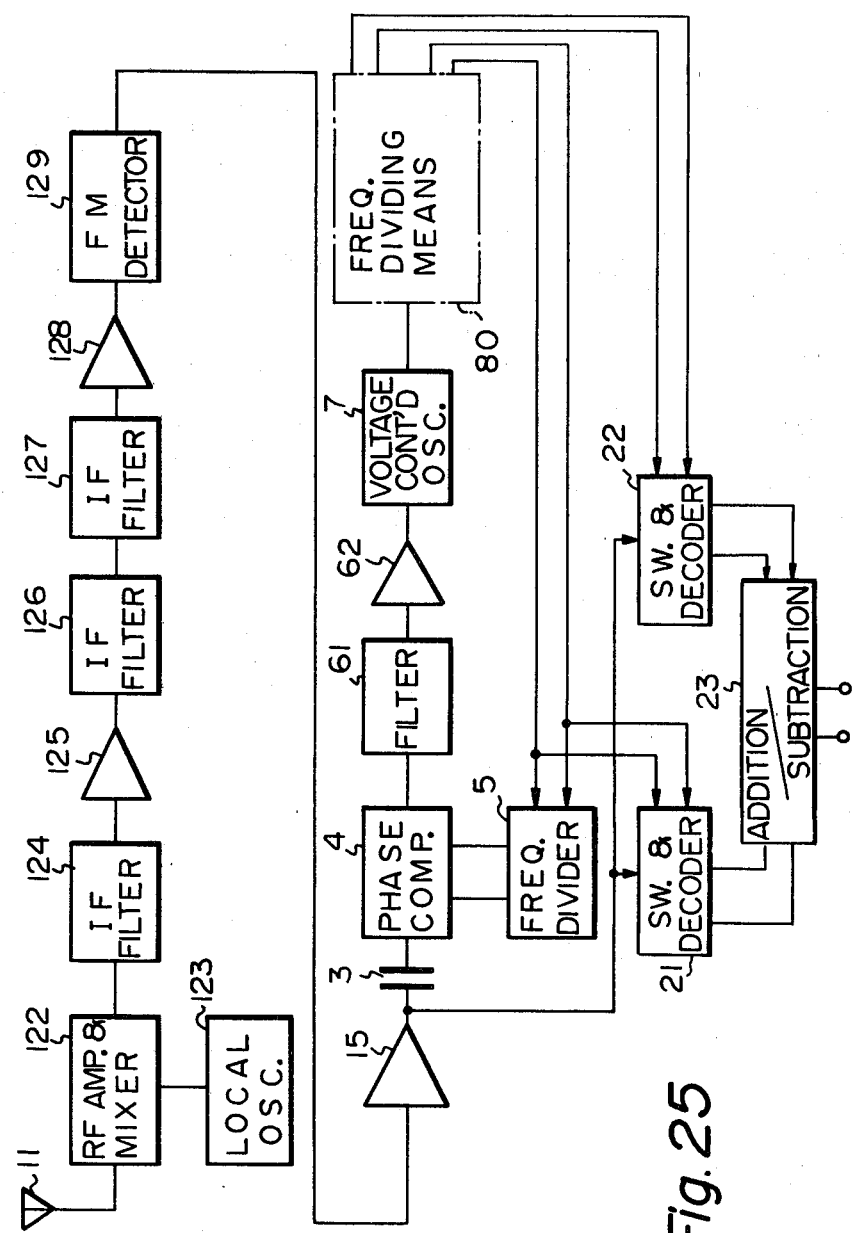
FIG. 25 illustrates a stereo demodulation system for an FM stereo broadcast receiver in accordance with a further embodiment of the present invention.
Figure 26:
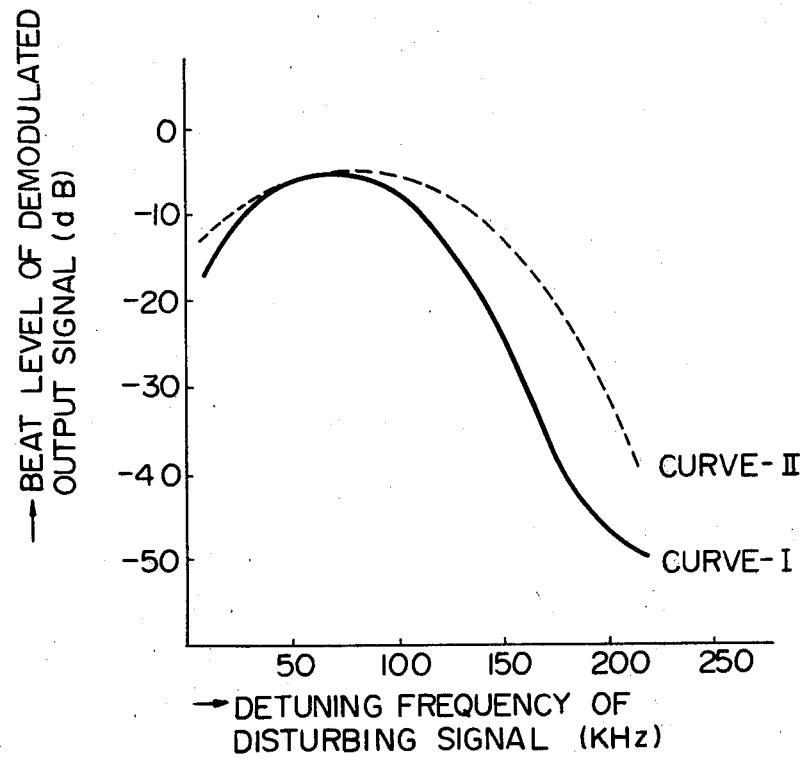
FIG. 26 illustrates the characteristic of the effect of the system of FIG. 25.

An example of the stereo demodulation systems which can eliminate, the beat noise due to the fifth harmonic frequency of subcarrier as well as the beat noise due to the third harmonic frequency of subcarrier is illustrated in FIG. 25. The circuit of FIG. 25 comprises intermediate frequency filters 124, 126 and 127. The characteristic of the intermediate frequency filters 124, 126 and 127 is such that a predetermined range of frequencies having the center frequency of the fifth harmonic frequency is specifically attenuated. The relationship between the detuning frequency the disturbing signal and the beat level of the signal supplied to the FM detector is illustrated in FIG. 26. The CURVE-I expressed by the solid line represents the characteristic of the case where three stage intermediate frequency filters have a $-3$ dB band width of 230 kHz. The CURVE-II expressed by the broken line represents the characteristic of the case where three stage intermediate frequency filters have a $-3$ dB band width of 280 kHz.

Figure 27:
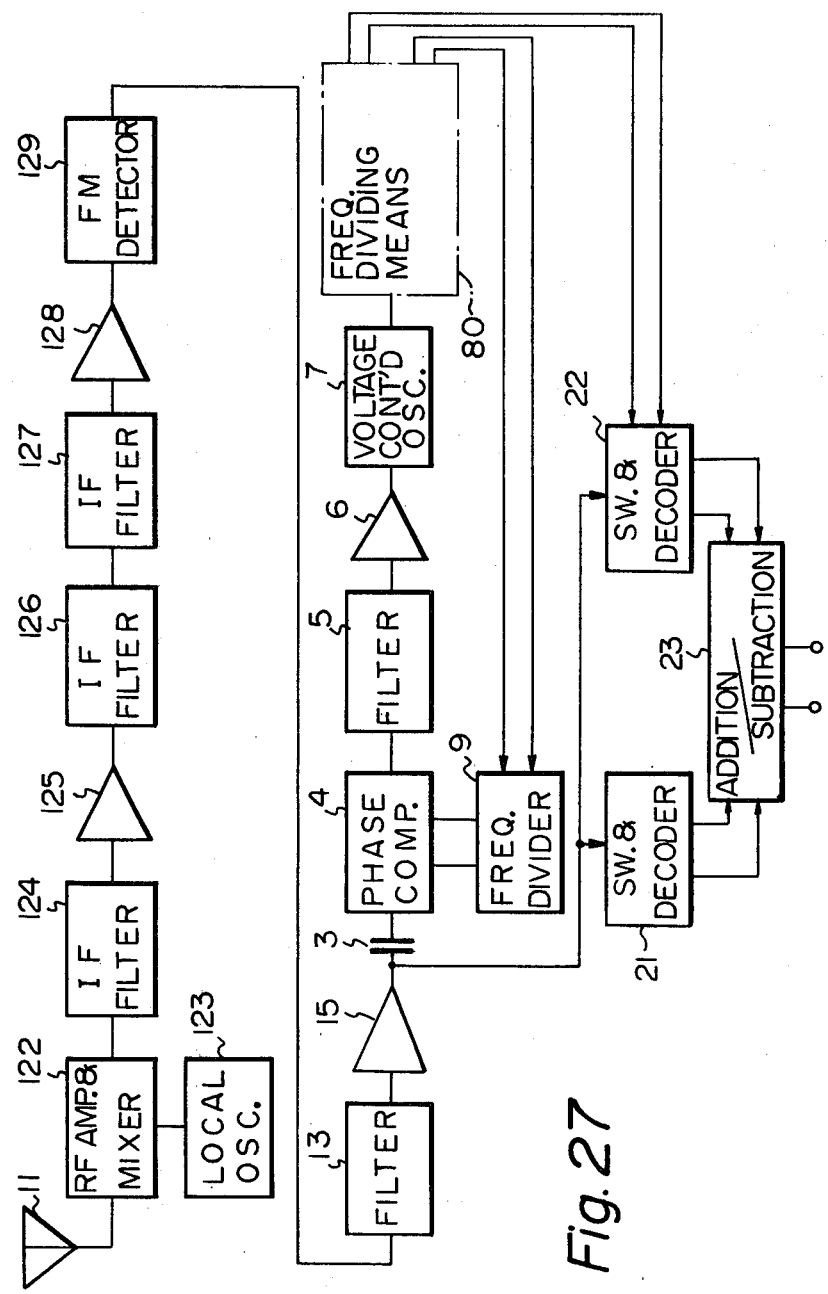
FIG. 27 illustrates a stereo demodulation system for an FM stereo broadcast receiver in accordance with a still further embodiment of the present invention.

Another example of the stereo demodulation systems which can eliminate the beat noise due to the fifth harmonic frequency of the subcarrier as well as the beat noise due to the third harmonic frequency of subcarriers is illustrated in FIG. 27. The circuit of FIG. 27 comprises a low pass filter or a trap filter 13 having a pole at a frequency of 190 kHz connected between the FM detector 129 and the buffer amplifier 15.

Figure 28:
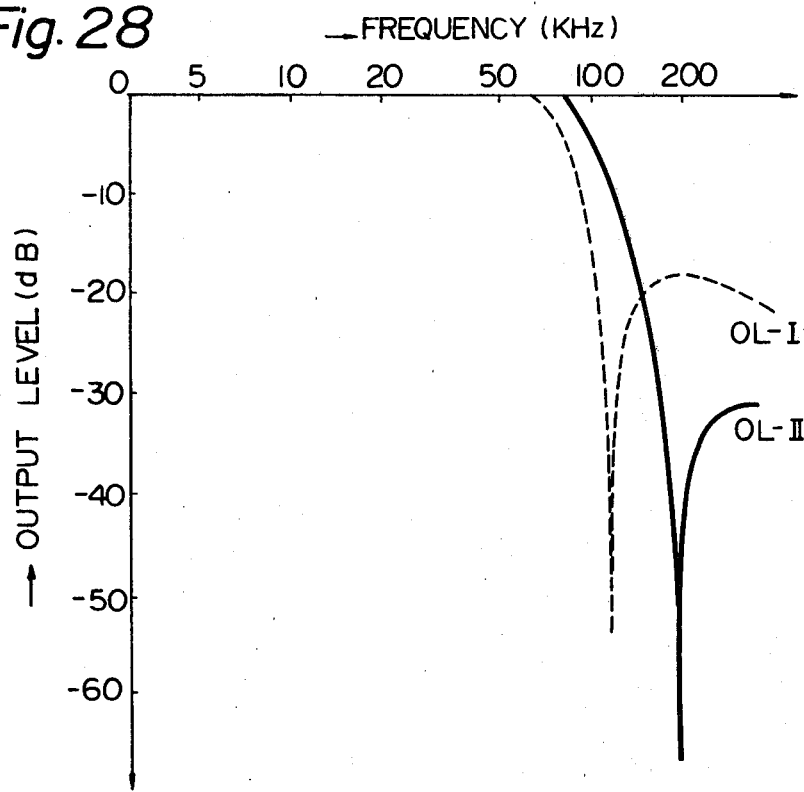
FIGS. 28 and 29 illustrate the characteristic of the effect of the system of FIG. 27.

The relationship between the frequency in kHz and the level of the output signal in dB is illustrated in FIG. 28. The characteristic of a prior art anti-birdy-noise filter is expressed by the broken line OL-I. The characteristic of a trap filter used in the circuit of FIG. 27 having a pole at a frequency of 190 kHz is expressed by the solid line OL-II.

Figure 29:
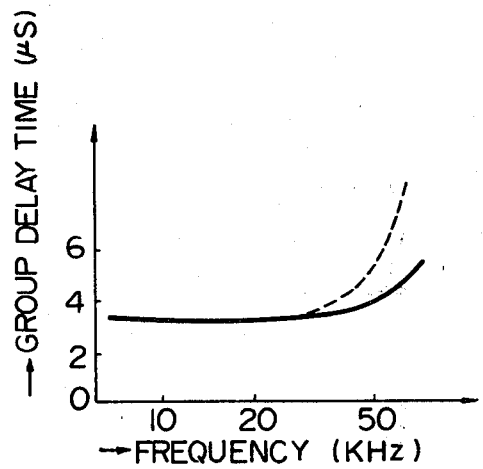

The relationship between the frequency in kHz and the group delay time in μsec is illustrated in FIG. 29. The characteristic of a prior art anti-birdy-noise filter is expressed by the broken line. The characteristic of a trap filter used in the circuit of FIG. 27 having a pole at a frequency of 190 kHz is expressed by a solid line.

We claim:

1. A stereo demodulation system for an FM stereo broadcast receiver in which a signal for switching and decoding a received stereo composite signal is produced in a demodulator, said system comprising:
    a voltage controlled oscillator which produces a signal of a specific frequency ($f_{vco}$),
    frequency dividing means for receiving the output signal of said voltage controlled oscillator and producing a first switching signal of 1/m frequency ($f_{vco}/m$) of said specific frequency and a second switching signal of 1/l frequency ($f_{vco}/l$) of said specific frequency,
    a phase comparator for phase comparing a further frequency divided signal of said first switching signal with a pilot signal contained in the received stereo composite signal,
    a low pass filter for filtering the output signal of said phase comparator and feeding back the thus filtered signal to said voltage controlled oscillator so that said voltage controlled oscillator, said frequency dividing means, said phase comparator and said low pass filter constituting a phase locked loop,
    a first switch and decoder circuit for switching and decoding said stereo composite signal by said 1/m frequency ($f_{vco}/m$) signal produced from said frequency dividing means,
    a second switch and decoder circuit for switching and decoding said stereo composite signal by an output signal of 1/l frequency ($f_{vco}/l$) of said predetermined frequency produced from said frequency dividing means, and
    an addition/subtraction circuit for adding or subtracting the output signals of said first and second switch and decoder circuit so that the signal component in the output signal of said first switch and decoder circuit, which component is a product of the harmonic frequency component of the subcarrier signal and the stereo composite signal, is cancelled by the signal component in the output signal of said second switch and decoder circuit, which component is a product of the fundamental frequency component of the switching signal and the stereo composite signal,
    characterized in that:
        said first switching signal of 1/m frequency ($f_{vco}/m$) and said second switching signal of 1/l frequency ($f_{vco}/l$) are produced by said frequency dividing means with the fixed phase relationship between said first and second switching signals.

2. A system as defined in claim 1, wherein said first switching signal of 1/m frequency ($f_{vco}/m$) and said second switching signal of 1/l frequency ($f_{vco}/l$) are produced from said frequency dividing means with no time delay and with the fixed phase relationship between said first and second switching signals.

3. A system as defined in claim 1 or 2, wherein said frequency means comprises a set of first frequency divider units (81A, 81B), a set of second frequency divider units (82, 83) and a logic unit (84), said set of frequency divider units dividing the supplied frequency into one-third of the supplied frequency and each second frequency divider unit dividing the supplied frequency into half of the supplied frequency, the output signals of said set of first frequency divider units (81A, 81B) and one of said second frequency divider units (82, 83) being supplied to a logic unit (84) to produce an input signal to the other of said second frequency divider units (82, 83), said first switching signal being produced from one of said second frequency divider units (82, 83) while said second switching signal being produced from the other of said second frequency divider units (82, 83).

4. A system as defined in claim 3, wherein each of said frequency dividing units consists of a positive edge triggering type J-K master-slave flip-flop circuit.

5. A system as defined in claim 3, wherein a time delay circuit (85) is connected between one of the input terminals of said one set of first frequency divider units and one of the input terminals of the other of said second frequency divider units.

6. A system as defined in claim 4, wherein said time delay circuit consists of a set of logic units (851, 852).

7. A system as defined in claim 4, wherein said time delay circuit consists of a capacitor (853) and a resistor (854).

8. A system as defined in claim 5, wherein an additional time delay circuit (87) is connected between the input terminals of said first frequency divider units and one of the input terminals of a logic unit (86), the output signal of which is supplied to the CLEAR input terminal of the other of said second frequency divider units.

9. A system as defined in claim 3, wherein a first time delay circuit (85) is connected between one of the input terminals of one of said set of first frequency divider units, and one of the input terminals of the other of said second frequency divider units, and a second time delay circuit (89) is connected between the output terminal of one of said second frequency divider units and one of input terminals of a logic unit (88) the output of which is supplied to one of input terminals of the other of said second frequency divider units.

10. A system as defined in claim 3, wherein a first time delay circuit (85) is connected between one of the input terminals of one of said set of first frequency divider units and one of the input terminals of the other of said second frequency divider units, and a second time delay circuit (89) is connected between the output terminal of one of said second frequency divider units and one of the input terminals of a logic unit (88), the output of which is supplied to the CLEAR input terminal of the other of said second frequency divider units.

11. A system as defined in claim 1 or 2, wherein said frequency dividing means comprises a transistor buffer circuit, a set of T type flip-flop circuits (91, 92, 93) a SET-RESET flip-flop circuit (97) and; a set of D type flip-flop circuits (94, 95, 96).

12. A system as defined in claim 11, wherein a first frequency divided signal with the ratio 6:1 having the duty 1/6 is produced from a third T type flip-flop circuit (93), a second frequency divided signal with the ratio 6:1 having the duty 1/6 is produced from a logical product point ($W_5$), which connects one of the outputs of a first T type flip-flop circuit (91), one of the outputs of a second T type flip-flop circuit (92) and one of the outputs of said third T type flip-flop circuit (93), a third frequency divided signal with the ratio 6:1 having the duty 1/2 is produced from said SET-RESET flip-flop circuit (97), which receives said first and second frequency divided signals, and is supplied to a third D type flip-flop circuit (96), a frequency divided signal with the ratio 2:1, having a fixed phase relationship with said third frequency divided signal is produced from a logical product point ($W_6$), which connects one of the outputs of said first T type flip-flop circuit (91) and one of the outputs of a first D type flip-flop circuit (94), and is supplied to a second D type flip-flop circuit (95), whereby said first switching signal is produced from said second D type flip-flop circuit and said second switching signal is produced from said third D type flip-flop circuit.

13. A system as defined in claim 11, wherein said SET-RESET flip-flop circuit consists of a four terminal network comprising two inverter units (IV1, IV2).

14. A system as defined in claim 1 or 2, further comprising band pass filters having a narrow pass band in the intermediate frequency amplification stage of said FM stereo broadcast receiver, the characteristic of said band pass filters being such that a predetermined range of frequencies with the fifth harmonic frequency at the center of said range is specifically attenuated.

15. A system as defined in claim 1, 2, or 14, further comprising a low pass filter between an FM detector stage and a buffer amplifier of said FM stereo broadcast receiver, the characteristic of said low pass filter being such that a predetermined range of frequencies with the fifth harmonic frequency at the center of said range is specifically attenuated.

* * * * *